(12) United States Patent
Jang et al.

(10) Patent No.: US 11,605,545 B2
(45) Date of Patent: Mar. 14, 2023

(54) WAFER CLEANING EQUIPMENT

(71) Applicant: SAMSUNG ELECTRONICS CO., LTD., Suwon-si (KR)

(72) Inventors: Hun Jae Jang, Suwon-si (KR); Seung Min Shin, Suwon-si (KR); Seok Hoon Kim, Suwon-si (KR); In Gi Kim, Suwon-si (KR); Tae-Hong Kim, Suwon-si (KR); Kun Tack Lee, Suwon-si (KR); Jinwoo Lee, Suwon-si (KR); Ji Hoon Cha, Suwon-si (KR); Yong Jun Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 591 days.

(21) Appl. No.: 16/692,051

(22) Filed: Nov. 22, 2019

(65) Prior Publication Data
US 2020/0335361 A1    Oct. 22, 2020

(30) Foreign Application Priority Data

Apr. 18, 2019  (KR) .......................... 10-2019-0045209

(51) Int. Cl.
*H01L 21/67* (2006.01)
*B08B 7/00* (2006.01)

(52) U.S. Cl.
CPC ........ *H01L 21/6704* (2013.01); *B08B 7/0042* (2013.01); *H01L 21/67115* (2013.01)

(58) Field of Classification Search
None
See application file for complete search history.

(56) References Cited

U.S. PATENT DOCUMENTS

| | | | |
|---|---|---|---|
| 8,574,369 B2 | 11/2013 | Miura | |
| 9,640,383 B2 | 5/2017 | Aiura et al. | |
| 9,688,569 B2 | 6/2017 | Pilch | |
| 9,853,579 B2 | 12/2017 | Subramani et al. | |
| 2010/0193483 A1* | 8/2010 | Chen .................. | B23K 26/0823 219/121.72 |
| 2013/0298832 A1 | 11/2013 | Ranish et al. | |
| 2016/0234881 A1 | 8/2016 | Rao et al. | |

(Continued)

FOREIGN PATENT DOCUMENTS

| | | |
|---|---|---|
| JP | 09-199846 A | 7/1997 |
| JP | 5118176 B2 | 1/2013 |

(Continued)

OTHER PUBLICATIONS

Translation of JP2016-001642 by Hachiya et al., published Jan. 7, 2016.*

*Primary Examiner* — Mikhail Kornakov
*Assistant Examiner* — Ryan L Coleman
(74) *Attorney, Agent, or Firm* — Lee IP Law, P.C.

(57) ABSTRACT

A wafer cleaning equipment includes a housing to be positioned adjacent to a wafer, a hollow region in the housing, a laser module that outputs a laser beam having a profile of the laser beam includes a first region having a first intensity and a second region having a second intensity greater than the first intensity, the laser beam being output into the hollow region, and a transparent window that covers an upper part of the hollow region and transmits the laser beam to be incident on an entirety of a lower surface of the wafer.

20 Claims, 20 Drawing Sheets

(56) References Cited

U.S. PATENT DOCUMENTS

2016/0293401 A1    10/2016  Hara et al.
2019/0311923 A1*   10/2019  Kim ................... H01L 21/6708
2020/0035517 A1*    1/2020  Hidaka ............. H01L 21/67051

FOREIGN PATENT DOCUMENTS

| JP | 2016-001642    | * | 1/2016  |
|----|----------------|---|---------|
| KR | 10-1082920 B1  |   | 11/2011 |
| KR | 10-2015-0047206 A |   | 5/2015  |
| KR | 10-2018-0116827 A |   | 10/2018 |
| KR | 10-2018-0124200 A |   | 11/2018 |
| KR | 10-2018-0127150 A |   | 11/2018 |

\* cited by examiner

WAFER CLEANING EQUIPMENT

CROSS-REFERENCE TO RELATED APPLICATION

Korean Patent Application No. 10-2019-0045209, filed on Apr. 18, 2019, in the Korean Intellectual Property Office, and entitled: "Wafer Cleaning Equipment," is incorporated by reference herein in its entirety.

BACKGROUND

1. Field

Embodiments relate to a wafer cleaning equipment.

2. Description of the Related Art

A wet cleaning process, which is widely used in semiconductor manufacturing, is a process of etching a hard mask or the like on a wafer with a high-temperature chemical solution. The wet cleaning process has been performed by batch equipment that simultaneously processes a plurality of wafers as a set in a conventional manner. When using batch equipment, problems, e.g., flowability defects, drying defects, degradation of dispersion uniformity, and the like, may occur on the wafers.

In order to solve these problems, using single-wafer processing equipment that processes each wafer one by one has been urged. However, an etch rate (E/R) may vary over the wafer even in the single-wafer equipment.

SUMMARY

According to an aspect, a wafer cleaning equipment may include a housing to be positioned adjacent to a wafer, a hollow region in the housing, a laser module that outputs a laser beam having a profile of the laser beam includes a first region having a first intensity and a second region having a second intensity greater than the first intensity, the laser beam being output into the hollow region, and a transparent window that covers an upper part of the hollow region and transmits the laser beam to be incident on an entirety of a lower surface of the wafer.

According to an aspect, a wafer cleaning equipment may include a housing to be positioned adjacent to a wafer, a hollow region in the housing, a laser module that output a laser beam having a profile of the laser beam includes a center region having a first intensity and an edge region having a second intensity different from the first intensity, the laser beam being output into the hollow region, and a transparent window that covers an upper part of the hollow region and transmits the laser beam to be incident on an entire lower surface of the wafer.

According to an aspect, a wafer cleaning equipment may include a housing to be positioned adjacent to a wafer including a center region and an edge region surrounding the center region, a hollow region in the housing, a laser module that irradiates the wafer with a laser beam having a profile that includes a center region having a first intensity and an edge region having a second intensity greater than the first intensity, and a transparent window that covers an upper part of the hollow region and transmits the laser beam.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, a wafer cleaning equipment according to some embodiments will be described with reference to FIGS. 1 to 9.

Figure 1:
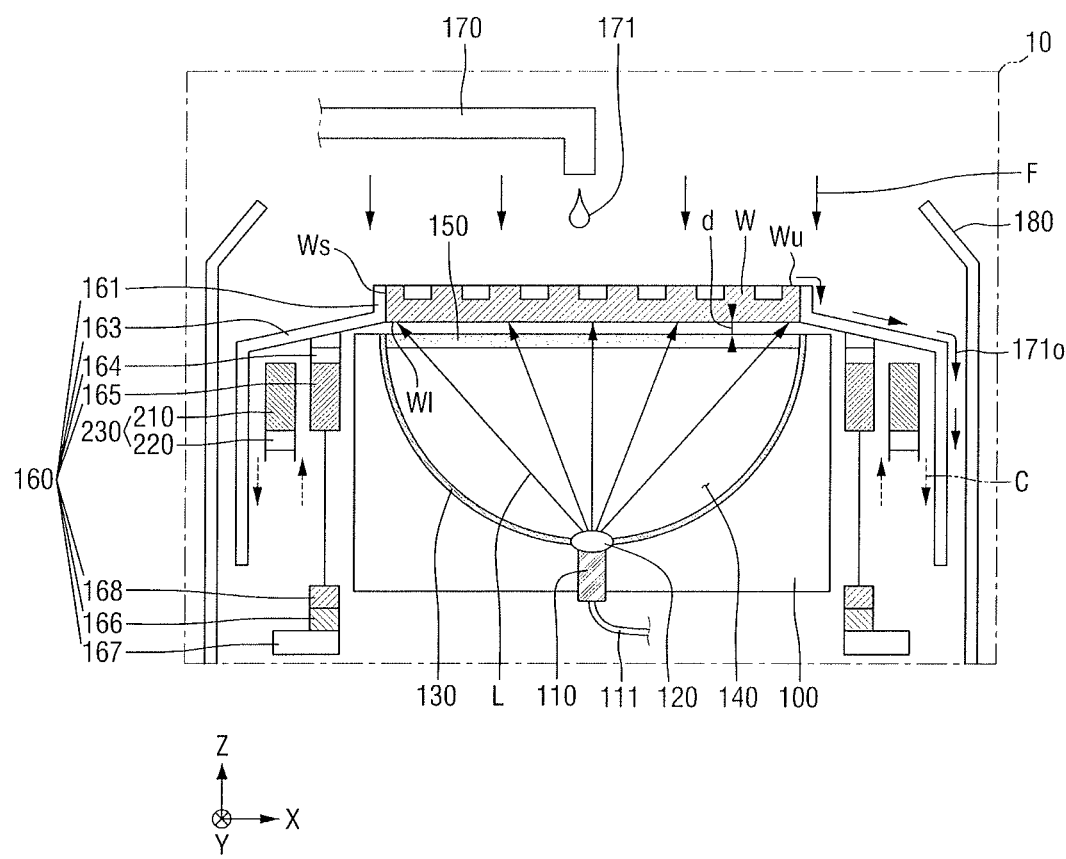
FIG. 1 illustrates a cross-sectional view for explaining a wafer cleaning equipment according to some embodiments.
Figure 2:
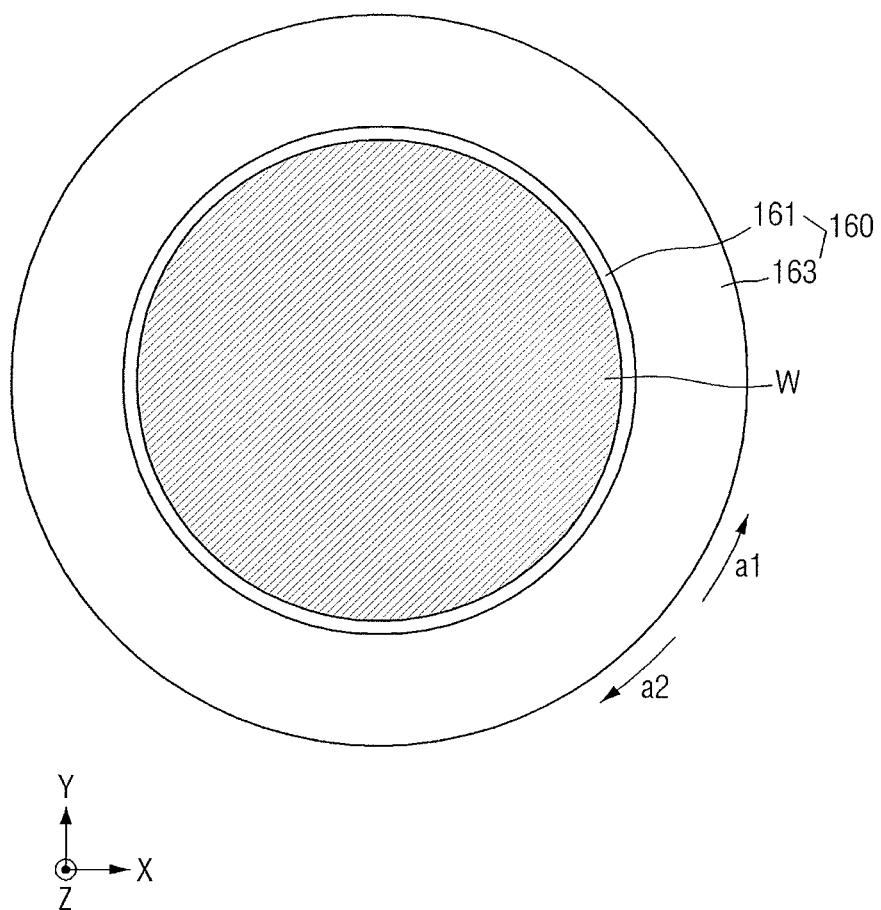
FIG. 2 illustrates a plan view for explaining rotation of the wafer in the wafer cleaning equipment of FIG. 1 in detail.

FIG. 1 illustrates a cross-sectional view of the wafer cleaning equipment according to some embodiments. FIG. 2 illustrates a plan view for explaining rotation of the wafer in the wafer cleaning equipment of FIG. 1 in detail.

Referring to FIGS. 1 and 2, a first wafer cleaning equipment 10 according to some embodiments includes a housing 100, a spinner 160, a nozzle 170, a bowl 180, a laser module 110, a hollow region 140, a reflector 130, a transparent window 150, and a fixing rotor module 230.

A first direction X may be any one direction in a horizontal direction. A second direction Y may be any one direction in the horizontal direction different from the first direction X. The second direction Y may intersect the first direction X. For example, the second direction Y may be a direction perpendicular to the first direction X. A third direction Z may be a direction intersecting the first direction X and the second direction Y. The third direction Z may be, e.g., perpendicular to both the first direction X and the second direction Y. The third direction Z may be, e.g., a vertical direction. Accordingly, the first direction X, the second direction Y, and the third direction Z may be directions orthogonal to each other.

The housing 100 may be located under the wafer W. That is, the housing 100 and the wafer W may be continuously disposed in the third direction Z. The housing 100 may heat a lower surface $W_l$ of the wafer W. An upper surface of the housing 100 may be adjacent to the lower surface $W_l$ of the wafer W. However, the housing 100 and the wafer W may not be in contact with each other.

The housing 100 may include the laser module 110, the hollow region 140, the reflector 130, and the transparent window 150. The housing 100 may serve to fix and support the positions of the laser module 110, the hollow region 140, the reflector 130, and the transparent window 150.

The housing 100 may be fixed below the wafer W. Therefore, even if the wafer W rotates in a first rotation direction a1 or a second rotation direction a2, the housing 100 may not rotate. In an implementation, the housing 100 may also rotate together with the wafer W or may rotate separately.

The spinner 160 may include a grip section 161, a chemical drain guide 163, an insulation block 164, a first rotor section 165, a side wall section 168, a bearing 166, and a fixed section 167.

The grip section 161 may be a portion in contact with a side surface $W_s$ of the wafer W to secure the wafer W. The grip section 161 together with the wafer W may rotated in the first rotation direction a1 or the second rotation direction a2.

The spinner 160 rotates the wafer W in the first rotation direction a1 or the second rotation direction a2 at an appropriate speed. This is because, if the rotation speed of the spinner 160 is too fast, an edge portion of the wafer W is relatively cooled and the temperature is not uniformly distributed. In such a case, the etch rate may also be different between the central portion and the edge portion of the wafer W. For example, the rotational speed of the spinner 160 may be limited, e.g., at 100 to 300 rpm.

The grip section 161 may include a thermal insulator. When the wafer W is heated by components in the housing 100, e.g., the laser module 110, the grip section 161 blocks the heat transfer and may prevent thermal damage to other components of the first wafer cleaning equipment 10.

The chemical drain guide 163 may guide the drain path of the chemical solution 171. The chemical drain guide 163 may be connected to the grip section 161. The chemical solution 171 may be pushed out to the side surface $W_s$ of the wafer W by a flow F after being used in the etching process on an upper surface $W_u$ of the wafer W.

After that, the chemical solution 171 reaches the chemical drain guide 163 via the grip section 161 on the side surface of the wafer W to become the discharged chemical solution 171o. The discharged chemical solution 171o may be discharged to the outside along the chemical drain guide 163.

Since the chemical drain guide 163 is located at a lower position than the bowl 180, the chemical solution 171 and the discharged chemical solution 171o from leaking to the outside may be prevented. In other words, the bowl 180 may extend along the third direction Z further than the chemical drain guide 163. This enhances the durability of the first wafer cleaning equipment 10 and prevents damage due to the discharged chemical solution 171o.

In addition, the chemical drain guide 163 may be disposed farther away from the wafer W than other components of the spinner 160, i.e., the insulation block 164, the first rotor section 165, the side wall section 168, the bearing 166, and the fixed section 167. In other words, the chemical drain guide 163 may extend along the horizontal directions, i.e., the first and second directions X and Y, away from the wafer W towards the bowl 180 to overlap other components of the spinner 160 along the third direction Z and then extends along the third direction Z. This prevents the discharged chemical solution 171o from damaging the insulation block 164, the first rotor section 165, the side wall section 168, the bearing 166, and the fixed section 167.

The insulation block 164 may constitute the side wall of the spinner 160 between the grip section 161 and the chemical drain guide 163. The insulation block 164 is made of a thermal insulator and may serve to block the heat received by the grip section 161 and the chemical drain guide 163 without transferring the heat to other components of the spinner 160.

The insulation block 164 is illustrated in FIG. 1 as being in contact with the grip section 161 and the chemical drain guide 163. In an implementation, the position of the insulation block 164 may be anywhere in the spinner 160. Also, although the insulation block 164 is illustrated as a single component in FIG. 1, in an implementation, the insulation block 164 may be disposed at multiple locations.

The first rotor section 165 may rotate the spinner 160 in a magnetic levitation manner with a second rotor section 210 to be described later. Since the first rotor section 165 is fixed to the insulation block 164, the side wall section 168, and the grip section 161 of the spinner 160, the spinner 160 may rotate as a whole by rotation of the first rotor section 165. Accordingly, the wafer W may also rotate together with the spinner 160.

The first rotor section 165 may include a magnetic material. The first rotor section 165 and the second rotor section 210 also including a magnetic material may also generate a rotational force through the magnetic force. This will be explained below in more detail.

The side wall section 168 may be in contact with the first rotor section 165 to form a side wall of the spinner 160. The side wall section 168 is illustrated in FIG. 1 as being located between the first rotor section 165 and the bearing 166. In an implementation, the side wall section 168 may include all the parts that make up the side wall of the spinner 160. Accordingly, the side wall section 168 may be a single component or may include a plurality of components.

The bearing 166 may be located between the side wall section 168 and the fixed section 167. In an implementation, the bearing 166 may be disposed anywhere between the fixed section 167 fixed and the first rotor section 165 to be rotated.

The bearing 166 allows the spinner 160 to rotate. That is, the bearing 166 may be a minimal configuration for allowing the spinner 160 to rotate, even though the spinner 160 includes the fixed section 167 fixed. The bearing 166 may rotate together with rotation of the first rotor section 165. The bearing 166 may simultaneously connect the fixed section 167, the side wall section 168, the first rotor section 165, the insulation block 164, the grip section 161, and the chemical drain guide 163. This enables the spinner 160 to be fixed and to rotate at the same time.

The fixed section 167 may fix and support the spinner 160 at the lower portion of the spinner 160. The fixed section 167 may not rotate. Alternatively, the fixed section 167 may be connected with the bearing 166 to allow a part of the spinner 160 to rotate. Therefore, some portions of the spinner 160 except the fixed section 167 may rotate to rotate the wafer W.

The nozzle 170 may be located above the wafer W and the spinner 160 along the third direction Z. The nozzle 170 may supply the chemical solution 171 to the upper surface $W_u$ of the wafer W, e.g., on a central portion of the upper surface $W_u$ of the wafer W. Rotation of the wafer W may cause the chemical solution 171 to spread over the entire upper surface the upper surface $W_u$ of the wafer W. The first wafer cleaning equipment 10 may apply a flow F in a downward direction for fixing the wafer W and uniformly supplying the chemical solution 171. This enables the chemical solution 171 to move from the central portion of the upper surface of the wafer W to the periphery.

The nozzle 170 is illustrated as injecting the chemical solution 171 in the downward direction from the upper surface of the wafer W in FIG. 1. In an implementation, the nozzle 170 may be disposed adjacent to the side surface $W_s$ of the wafer W at a point higher than the upper surface $W_u$ of the wafer W along the third direction Z. The nozzle 170 may discharge the chemical solution 171 in the direction of the side surface $W_s$ to supply the chemical solution 171 to the upper surface $W_u$ of the wafer W.

The chemical solution 171 may be a solution for etching the upper surface of the wafer W. The chemical solution 171 may vary depending on the target material to be etched. For example, if the wafer to be etched is SiN or polysilicon, the chemical solution 171 may include, e.g., at least one of phosphoric acid, ammonia solution, and tetramethylammonium hydroxide (TMAH).

The chemical solution 171 is supplied by the nozzle 170. The nozzle 170 provides the chemical solution 171 onto the upper surface $W_u$ of the wafer W at an appropriate amount and speed. If the chemical solution 171 is provided too much or too fast, the temperature rise of the wafer W may be delayed accordingly. Thus, for example, the nozzle 170 may provide the chemical solution 171 onto the wafer W at a speed of 0.1 L/min to 1 L/min.

The bowl 180 may be located outside the wafer W, the spinner 160, and the housing 100, e.g., spaced apart from these components in the first and second directions X and Y. The bowl 180 may extend in the third direction Z to be higher than the upper surface of the wafer W. The bowl 180 may block the outflow of the chemical solution 171 and fumes from which the chemical solution 171 is vaporized. The bowl 180 may prevent other parts of the first wafer cleaning equipment 10 from being damaged by the chemical solution 171 and the fumes.

The laser module 110 may be inside the housing 100. The laser module 110 may irradiate the lower surface $W_1$ of the wafer W with a laser beam L. The laser module 110 may be located under the hollow region 140. The laser beam L output by the laser module 110 may pass through the hollow region 140 and the transparent window 150 to reach the lower surface $W_1$ of the wafer W.

The laser module 110 may include a laser supply section 111 and an aspheric lens 120. The laser beam of the laser module 110 may be supplied through the laser supply section 111. The laser supply section 111 may be connected to the outside to form a path through which a laser beam is supplied. The laser supply section 111 may include, e.g., an optical fiber or waveguide. By supplying the laser beam from a laser external to the first wafer cleaning equipment 10 via the laser supply section 111, instead of a module using mirrors requiring a relatively long reflection distance, the size of the first wafer cleaning equipment 10 may be reduced.

The aspheric lens 120 may include a plurality of lenses. The aspheric lens 120 may transform the profile of the laser beam supplied by the laser supply section 111, as explained below in more detail.

The hollow region 140 may be an empty space in the housing 100. The hollow region 140 may be a region in which the laser beam L emitted by the laser module 110 progresses to the lower surface of the wafer W.

The upper surface of the hollow region 140 may be covered with a transparent window 150. This allows the hollow region 140 to be completely isolated from the outside by the housing 100 and the transparent window 150 to prevent contamination of the laser module 110 due to the chemical solution 171 and fumes generated by the chemical solution 171.

The inside of the hollow region 140 may be a vacuum. This enables the progress of the laser beam L to be facilitated. In an implementation, the inside of the hollow region 140 may be filled with a gas medium that does not impede the progress of the laser beam L.

The hollow region 140 may have a hemispherical shape and the reflector 130 may line a surface of the housing 100 defining the hollow region 140. Thus, the laser beam L that is reflected by the lower surface $W_1$ of the wafer W is reflected by the reflector 130 to be incident on the lower surface $W_1$ of the wafer W again.

When the light generated by reflection of the laser beam L by the wafer W reaches other parts of the first wafer cleaning equipment 10, damage to the equipment may occur. Thus, the reflector 130 may serve to block the reflected laser from reaching other components of the first wafer cleaning equipment 10. At the same time, the reflector 130 may improve the efficiency of the heating of the wafer W, by reflecting the reflected laser again to reach the lower surface $W_1$ of the wafer W.

The transparent window 150 may be a transparent material through which the laser beam L may pass. For example, the transparent window 150 may be made of quartz. However, the present embodiment is not limited thereto.

The transparent window 150 and the wafer W may be in close proximity. An interval between the transparent window 150 and the wafer W may be a width d. The width d may be sufficiently small to prevent the laser beam L from being incident surfaces other than the lower surface $W_1$ of the wafer W. If the housing 100 is not to rotate with the wafer W, the transparent window 150 and the wafer W may not be in contact with each other.

Since the entire lower surface $W_1$ of the wafer W needs to be heated, the lower surface $W_1$ of the wafer W and the interface of the transparent window 150 may correspond to each other, e.g., may completely overlap along the third direction Z. The side surface $W_s$ of the wafer W may also be exposed to the laser beam L by the transparent window 150.

The aspheric lens 120 may transform the laser beam. Specifically, the laser beam L supplied by the laser supply section 111 may have a Gaussian profile, which the aspheric lens 120 may transform into a required profile, e.g., a more uniform intensity profile, discussed in detail below.

The fixing rotor module 230 may be spaced apart from the spinner 160. The fixing rotor module 230 may surround the spinner 160. Specifically, the fixing rotor module 230 may be located between the chemical drain guide 163 and the first rotor section 165.

The fixing rotor module 230 may include a second rotor section 210 connected to a rotor support section 220. The second rotor section 210 may include a magnetic material. The second rotor section 210 may generate a rotational force through the magnetic force together with the first rotor section 165 described above. The second rotor section 210 is spaced apart from the insulation block 164, the side wall section 168, and the grip section 161 of the spinner 160, and may be protected by the chemical drain guide 163.

Figure 3:
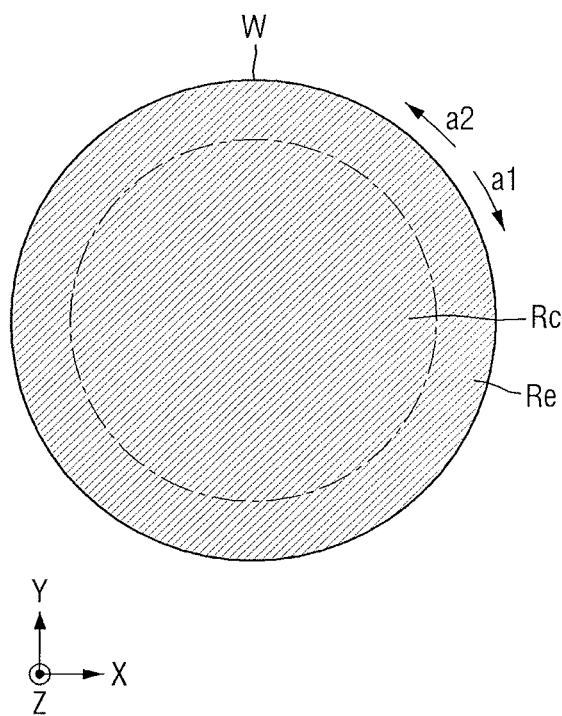
FIG. 3 illustrates a bottom view of a lower surface of the wafer of FIG. 1 in detail.

FIG. 3 is a bottom view of the lower surface $W_1$ of the wafer W of FIG. 1 in detail. Referring to FIG. 3, the lower surface $W_1$ of the wafer W may include a center region Rc and an edge region Re. The center region Rc of the wafer W may mean the central portion of the wafer W and the edge region Re may mean an edge region surrounding the center region Re.

Referring to FIGS. 1 to 3, the first wafer cleaning equipment 10 according to some embodiments may uniformly heat the center region Re. In addition, the first wafer cleaning equipment 10 may heat the edge region Re to an extent different from the center region Re. That is, the first wafer cleaning equipment 10 may heat the edge region Re more strongly than the center region Re.

The first wafer cleaning equipment 10 may have a flow F in the downward direction on the upper surface $W_u$ of the wafer W. Since the flow F passes over the edge or side surface $W_s$ of the wafer W to be discarded from the wafer W, unintended cooling of the edge portion of the wafer W may occur.

In order to offset the unintended cooling, the first wafer cleaning equipment 10 may adjust the properties of the aspheric lens 120 and/or the reflector 130 to adjust the profile of the laser beam L. Thus, center region Rc of the lower surface $W_1$ of the wafer W may be uniformly heated, and the edge region Re thereof may be heated relatively strongly as compared to the center region Re.

The laser beam L of the laser module 110 may be a continuous wave laser beam that is continuously irradiated without turning on/off the laser. Of course, the frequency and wavelength components of the laser beam itself also exist in the continuous wave laser beam. The laser beam L of the laser module 110 may be irradiated continuously at a constant intensity and wavelength region. Using the continuous wave laser beam may significantly increase the efficiency of temperature rise and the etch rate of the first wafer cleaning equipment 10.

In an implementation, the laser beam L of the laser module 110 of the first wafer cleaning equipment 10 may be a pulsed laser beam generated when the laser is periodically turned on/off and the laser is discontinuously irradiated. Of course, apart from existence of the above-mentioned on/off frequency, the components of frequency and wavelength of the laser itself also exist in a pulsed laser beam when the laser is on.

The period of the pulse type laser beam L may be in units of several nsec or several psec. Specifically, the frequency of the pulse type of the laser beam L may be 10 to 1000 MHz. If the frequency is too low, it is not suitable because physical punching rather than heating may be performed on the wafer W. A frequency of the pulse may be changed for the pulsed type laser beam L to adjust the heated intensity even without adjusting the thermal energy.

Figure 4:
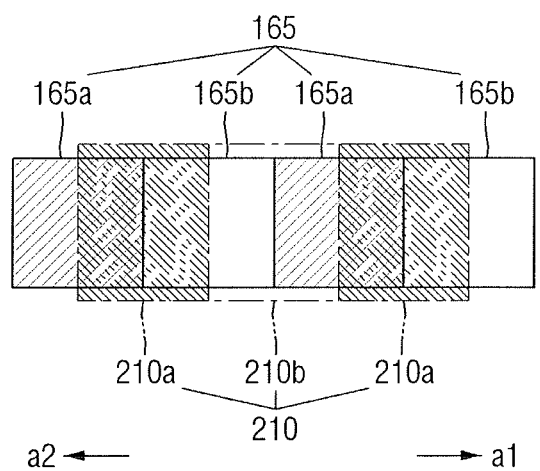
FIG. 4 illustrates the operation of first and second rotor sections of FIG. 1.

FIG. 4 illustrates the operation of the first and second rotor sections of FIG. 1. Referring to FIGS. 1 to 4, the first rotor section 165 may include a first magnetic pole region 165a and a second magnetic pole region 165b having magnetic poles different from each other. For example, the first magnetic pole region 165a may be an N pole and the second magnetic pole region 165b may be an S pole, or vice versa. The first magnetic pole region 165a and the second magnetic pole region 165b may be arranged alternately with each other.

Similarly, the second rotor section 210 may include a first magnetic pole region 210a and a second magnetic pole region 210b having magnetic poles different from each other. For example, the first magnetic pole region 210a may be the N pole and the second magnetic pole region 210b may be the S pole, or vice versa. Alternatively, the first magnetic pole region 210a of the second rotor section may be the S pole, and the second magnetic pole region 210b of the second rotor section may be the N pole.

The first magnetic pole region 165a of the first rotor section may have the same magnetic pole as that of the first magnetic pole region 210a of the second rotor section. The second magnetic pole region 165b of the first rotor section may have the same magnetic pole as that of the second magnetic pole region 210b of the second rotor section.

The first magnetic pole region 165a of the first rotor section, the second magnetic pole region 165b of the first rotor section, the first magnetic pole region 210a of the second rotor section, and the second magnetic pole region 210b of the second rotor section may be arranged alternately with each other. The first magnetic pole region 165a of the first rotor section, the second magnetic pole region 165b of the first rotor section, the first magnetic pole region 210a of the second rotor section, and the second magnetic pole region 210b of the second rotor section may be implemented through an electromagnet.

As the first magnetic pole region 165a of the first rotor section, the second magnetic pole region 165b of the first rotor section, the first magnetic pole region 210a of the second rotor section, and the second magnetic pole region 210b of the second rotor section are arranged alternately with each other, the first rotor section 165 may rotate in the first rotation direction a1 and the second rotation direction a2.

Specifically, the first magnetic pole region 165a of the first rotor section and the first magnetic pole region 210a of the second rotor section have a force of pushing each other, and the first magnetic pole region 165a of the first rotor section and the second magnetic pole region 210b of the second rotor section have a force of attracting each other. Similarly, the second magnetic pole region 165b of the first rotor section and the second magnetic pole region 210b of the second rotor section have a force of pushing each other, and the second magnetic pole region 165b of the first rotor section and the first magnetic pole region 210a of the second rotor section have a force of attracting each other As a result, the first rotor section 165 and the second rotor section 210 arranged alternately have a force of rotating so that different regions face each other. That is, the first rotor section 165 and the second rotor section 210 rotate toward the side at which the first magnetic pole region 165a of the first rotor section and the second magnetic pole region 210b of the second rotor section face each other, and the second magnetic pole region 165b of the first rotor section and the first magnetic pole region 210a of the second rotor section face each other. After that, if the magnetic pole region in which the first rotor section 165 or the second rotor section 210 are arranged alternately is changed in reverse, rotation may be further accelerated again.

In this way, the spinner 160 may rotate in accordance with the magnetic levitation manner. In such a manner of the first wafer cleaning equipment 10 according to some embodiments, since the rotational force is generated without contact, mechanical wear is limited and durability may be maintained. In addition, since a thermal conduction does not occur, the life expectancy of the equipment can also be extended. Finally, since there is no friction, the rotation of the wafer W may be performed uniformly and stably.

The rotor support section 220 may support the second rotor section 210 below the second rotor section 210. The rotor support section 220 may be fixed to the second rotor section 210. The rotor support section 220 may have a fixed position. Therefore, the second rotor section 210 is also fixed, and the first rotor section 165 relatively rotatable by the bearing 166 may rotate in the first rotation direction a1 or the second rotation direction a2.

Since the first rotor section 165 and the second rotor section 210 are magnetic materials, they may be vulnerable to heat. Therefore, a refrigerant C may be provided between the first rotor section 165 and the second rotor section 210 to cool the first rotor section 165 and the second rotor section 210. The refrigerant C may be, e.g., $N_2$ gas.

Figure 5:
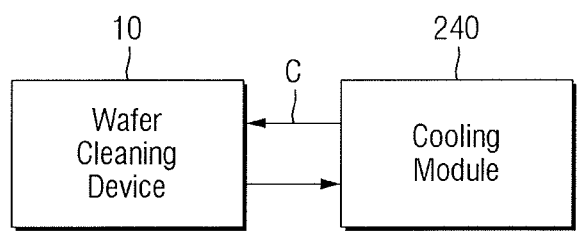
FIG. 5 illustrates the wafer cleaning equipment and a cooling module of FIG. 1.

FIG. 5 illustrates the wafer cleaning equipment and the cooling module of FIG. 1. Referring to FIG. 5, the cooling module 240 may provide the refrigerant C to the first wafer cleaning equipment 10. Therefore, the first wafer cleaning equipment 10 may cool the first rotor section 165 and the second rotor section 210. In an implementation, the cooling module 240 may be located inside the first wafer cleaning equipment 10.

Figure 6:
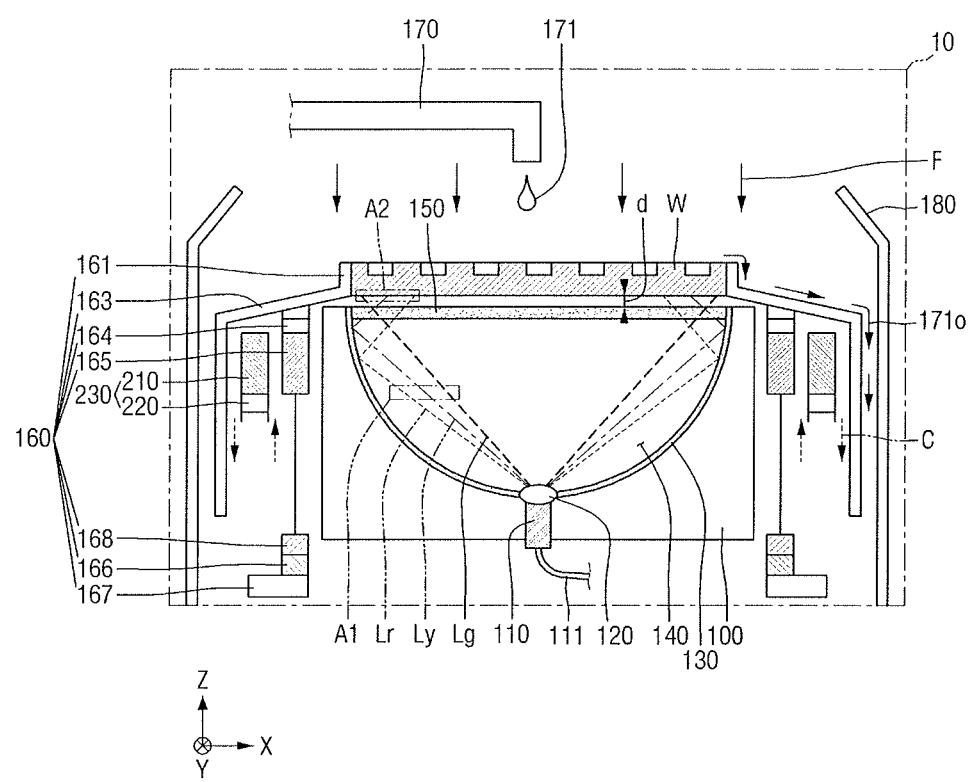
FIG. 6 illustrates a path of the laser beam in the wafer cleaning equipment of FIG. 1.
Figure 7:
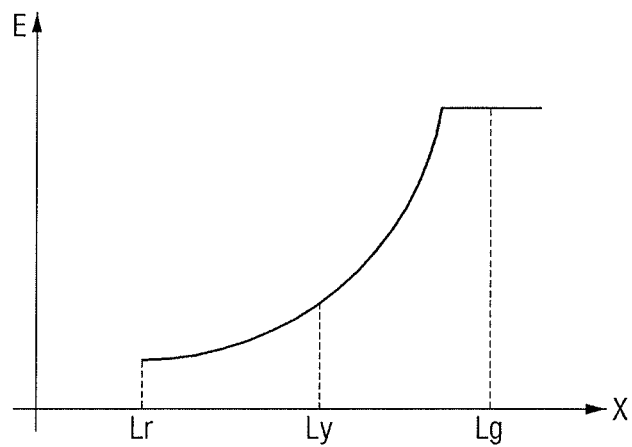
FIG. 7 illustrates a profile of the laser beam of a region A1 of FIG. 6.
Figure 8:
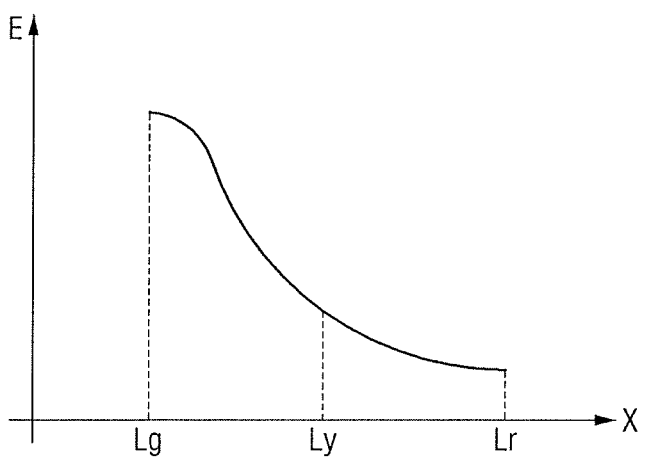
FIG. 8 illustrates a profile of the laser beam of a region A2 of FIG. 6.
Figure 9:
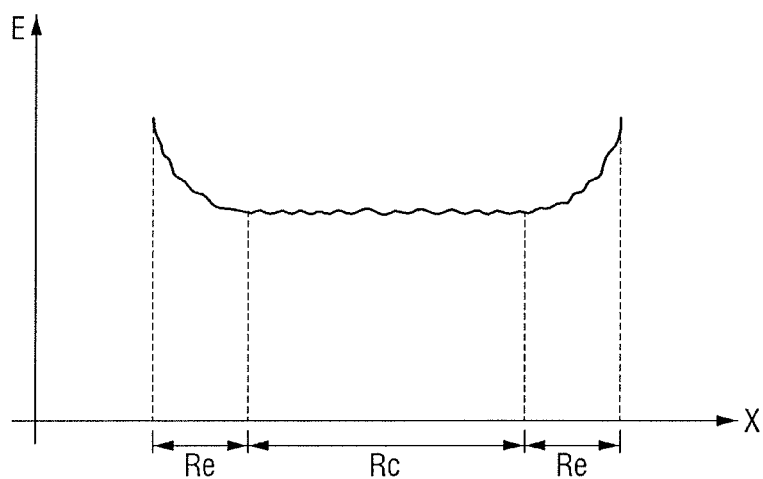
FIG. 9 illustrates a profile of the laser beam reaching the wafer of FIG. 1.

FIG. 6 illustrates a path of an outer portion of the laser beam of the wafer cleaning equipment of FIG. 1. FIG. 7 illustrates a profile of the laser beam of a region A1 of FIG. 6. FIG. 8 illustrates a profile of the laser beam at a region A2 of FIG. 6. FIG. 9 illustrates a profile of the laser beam incident on the wafer of FIG. 1.

Referring to FIGS. 6 through 9, in the first wafer cleaning equipment 10 according to some embodiments, the aspheric lens 120 may expand the laser bean L to be wider than the transparent window 150 and the wafer W. Thus, an outermost portion of the laser beam L is incident on the reflector 130 rather than the lower surface $W_1$ of the wafer W and then is reflected to be incident on the lower surface $W_1$ of the wafer W. Light having the lowest energy, e.g., red light Lr, may be located in the outermost portion of the laser beam L. Light having higher energies, e.g., yellow light Ly and green light Lg, may be located inside the red light Lr. In FIG. 6, for convenience, the red light Lr, the yellow light Ly and the green light Lg are illustrated as being separated from each other, but the red light Lr, the yellow light Ly and the green light Lg are continuous in the laser beam L, and light of other colors in the middle is omitted.

In FIG. 7, energies of the red light Lr, the yellow light Ly and the green light Lg in region A1 are illustrated. The energy of the red light Lr is the lowest and the energy of the green light Lg is the highest. The yellow light Ly has energy between the red light Lr and the green light Lg. Referring to FIG. 8, in region A2, after have been reflected by the reflector 130, the positions of the red light Lr, the yellow light Ly and the green light Lg are reversed, and the green light Lg is irradiated to the outermost side, and the yellow light Ly and the red light Lr may be irradiated sequentially to the inside.

Since the laser beam L is directly incident on and reflected onto the edge region Re, while only being directly incident on the center region Rc, light having a higher intensity may be incident on the edge region Re than that incident on the center region Rc, as illustrated in FIG. 9. In other words, a profile of the laser beam incident on the wafer may have a first region of a first intensity, e.g., incident on to the center region Rc, and a second region having a second intensity, e.g., incident on the edge region Re. The second intensity may be greater than the first intensity, as shown in FIG. 9. Accordingly, the additional heating of the edge region Re may increase the etch rate of the edge region Re to provide a uniform etch rate across the wafer W or may be used to intentionally further etch the edge region Re than the center region Rc. In an implementation, different laser beam profiles having different intensity regions may be incident on the wafer to control a heating profile of the wafer and, accordingly, etch rate across the wafer.

Figure 10:
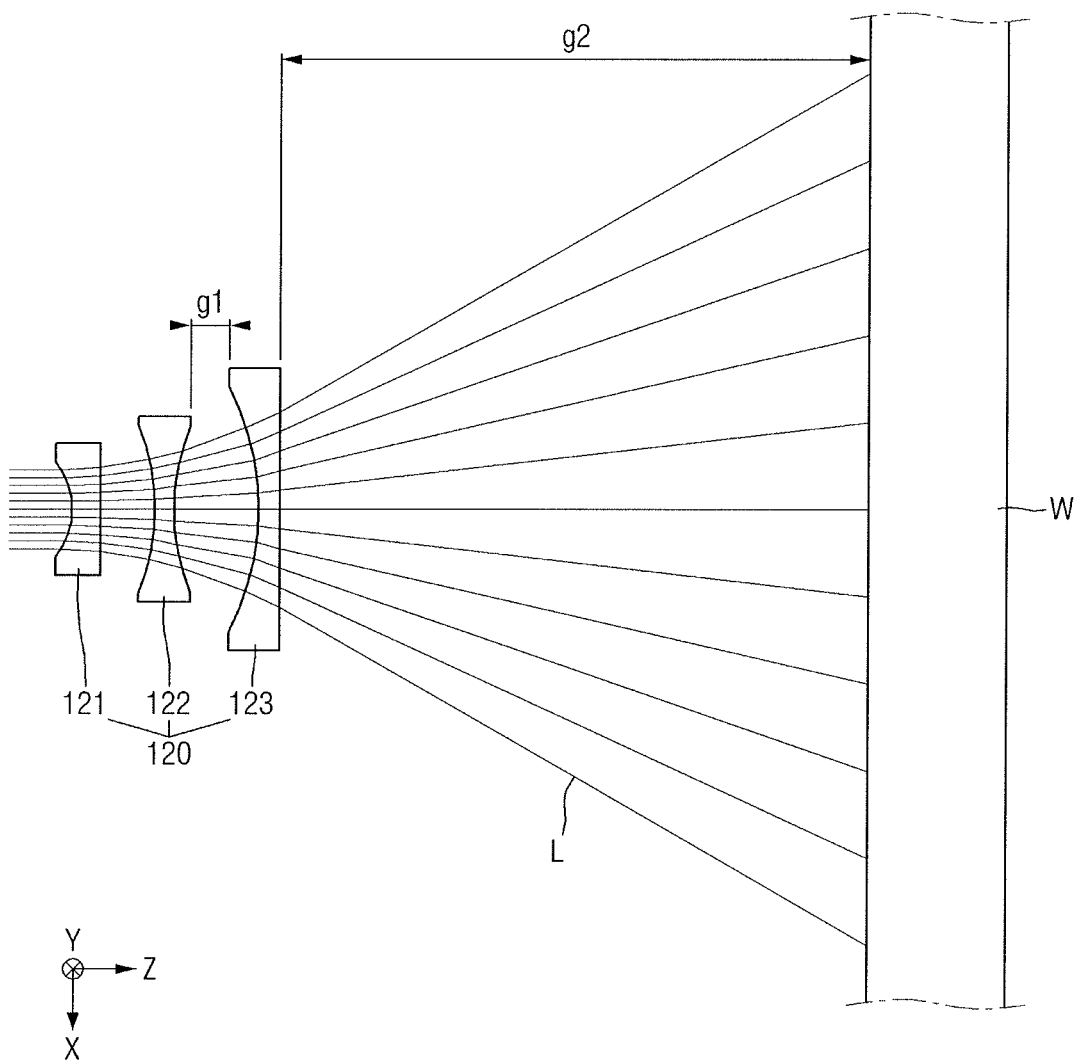
FIG. 10 illustrates an aspheric lens of the wafer cleaning equipment according to some embodiments in detail.

Hereinafter, the first wafer cleaning equipment 10 according to some embodiments will be described with reference to FIGS. 1, 3 and 10. Repeated parts of the above-described embodiment will be simplified or omitted. FIG. 10 is a view for explaining an aspheric lens of the wafer cleaning equipment according to some embodiments in detail.

Referring to FIGS. 1, 3 and 10, the aspheric lens 120 of the first wafer cleaning equipment 10 according to some embodiments may include a first lens 121, a second lens 122 and a third lens 123. Although three lenses are illustrated, the number of lenses may be changed variously as necessary.

The first lens 121, the second lens 122 and the third lens 123 provide the laser beam L onto the lower surface $W_1$ of the wafer W with an appropriate profile through refraction. As a first gap g1 between the second lens 122 and the third lens 123 is adjusted, the profile of the laser beam L may also change. Thus, the aspheric lens 120 may further heat the edge region Re rather than the center region Rc of the wafer W by adjusting the first gap g1. For example, a size of the edge region Re may change in accordance with the size of the first gap g1. The second gap g2 may change by adjusting the first gap g1. Thus, the aspheric lens 120 may adjust the profile of the laser beam L by the first gap g1 and the second gap g2.

The first gap g1 and the second gap g2 may be selected and fixed at the time of manufacturing of the first wafer cleaning equipment 10, and may be adjustable in real time depending on the size and type of the wafer W. If the first gap g1 and the second gap g2 are adjustable, an optimized cleaning process may be performed for several types of wafers W.

FIG. 10 exemplarily illustrates a change in the first gap g1 between the second lens 122 and the third lens 123, but the gap between the first lens 121 and the second lens 122 may also be adjusted. Also, if more lenses are included, the gap between each lens may be precisely adjusted to adjust the profile of the laser beam L. Also, a beam diameter or an area of the laser beam incident on the first lens 121 may be adjusted to adjust the final profile of the laser beam L.

Figure 11:
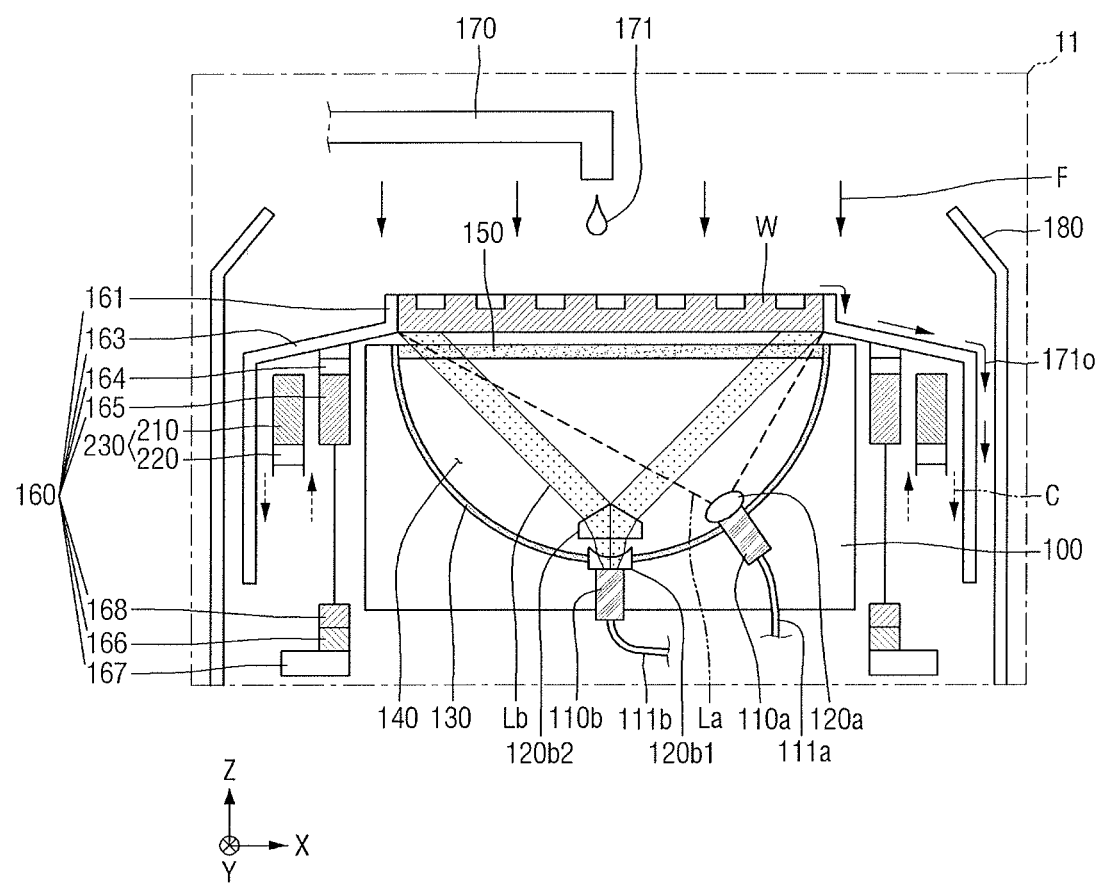
FIG. 11 illustrates a cross-sectional view of the wafer cleaning equipment according to some embodiments.

Hereinafter, a second wafer cleaning equipment 11 according to some embodiments will be described with reference to FIGS. 3, 11 and 12. Repeated parts of the above-described embodiment will be simplified or omitted. FIG. 11 is a cross-sectional view for explaining the wafer cleaning equipment according to some embodiments, and FIG. 12 is a view for explaining the shape of the second laser of FIG. 11 in detail.

Figure 12:
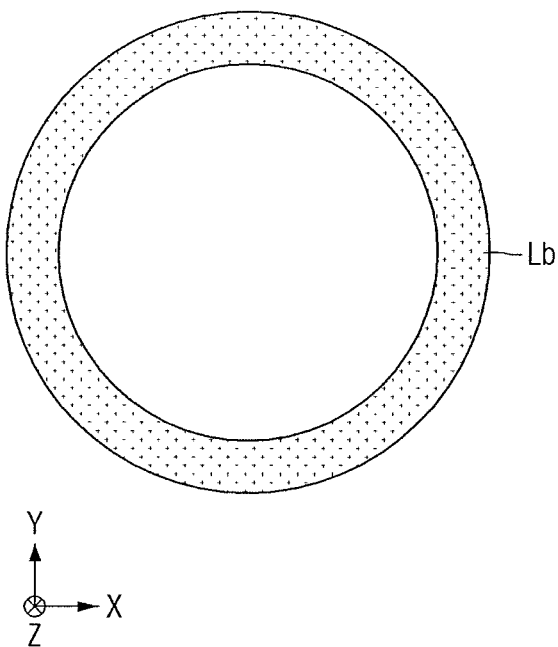
FIG. 12 illustrates a view for explaining a shape of a second laser of FIG. 11 in detail.

Referring to FIGS. 3, 11 and 12, the second wafer cleaning equipment 11 according to some embodiments includes a first laser module 110a and a second laser module 110b. Although FIG. 11 illustrates two laser modules some implementations may include three or more laser modules.

The first laser module 110a, a first laser supply section 111a and a first aspheric lens 120a may be the same as the laser module 110, the laser supply section 111 and the aspheric lens 120 of FIG. 1, respectively. In FIG. 11, unlike FIG. 1, the first laser module 110a is disposed to be inclined to the side rather than at the center of the hollow region 140.

The first laser beam La emitted by the first laser module 110a may uniformly heat the lower surface of the wafer W. For example, the first laser beam La may not be wider than the transparent window 150, so that it is not incident on and reflected by the reflector 130. Thus, the first laser beam La may have a uniform profile over an entirety of the lower surface $W_1$ of the wafer W, i.e., both the edge region Re and the center region Rc.

The second laser module 110b may be inside the housing 100. The laser module 110b may irradiate the lower surface $W_1$ of the wafer W with a ring-shaped second laser beam Lb. The second laser module 110b may be located under the hollow region 140. The second laser beam Lb output by the second laser module 110b may pass through the hollow region 140 and the transparent window 150 to reach the edge region Re of the lower surface of the wafer W.

The second laser module 110b may include a second laser supply section 111b, a refractive lens 120b1, and an axicon lens 120b2. The second laser beam Lb of the second laser module 110b may be supplied through the second laser supply section 111b. The second laser supply section 111b may be connected to the outside to form a path through which the second laser beam Lb is supplied.

The refractive lens 120b1 may direct the second laser beam Lb of the second laser module 110b to the axicon lens 120b2. That is, the refractive lens 120b1 may refract the second laser beam Lb to reach the axicon lens 120b2. The axicon lens 120b2 may process the second laser beam Lb into a ring shape as shown in FIG. 12. The axis lens 120b2 may transform the second laser beam Lb into a symmetrical ring shape to reach the edge region Re of the wafer W.

Thus, the second wafer cleaning equipment 11 according to some embodiments may increase heating the edge region Re to enhance the etch rate of the edge region Re. Since the ring shape of the second laser beam Lb heats all parts of the edge region Re simultaneously, regardless of the rotation of the edge region Re of the wafer W, the temperature of the edge region Re may be enhanced uniformly.

Figure 13:
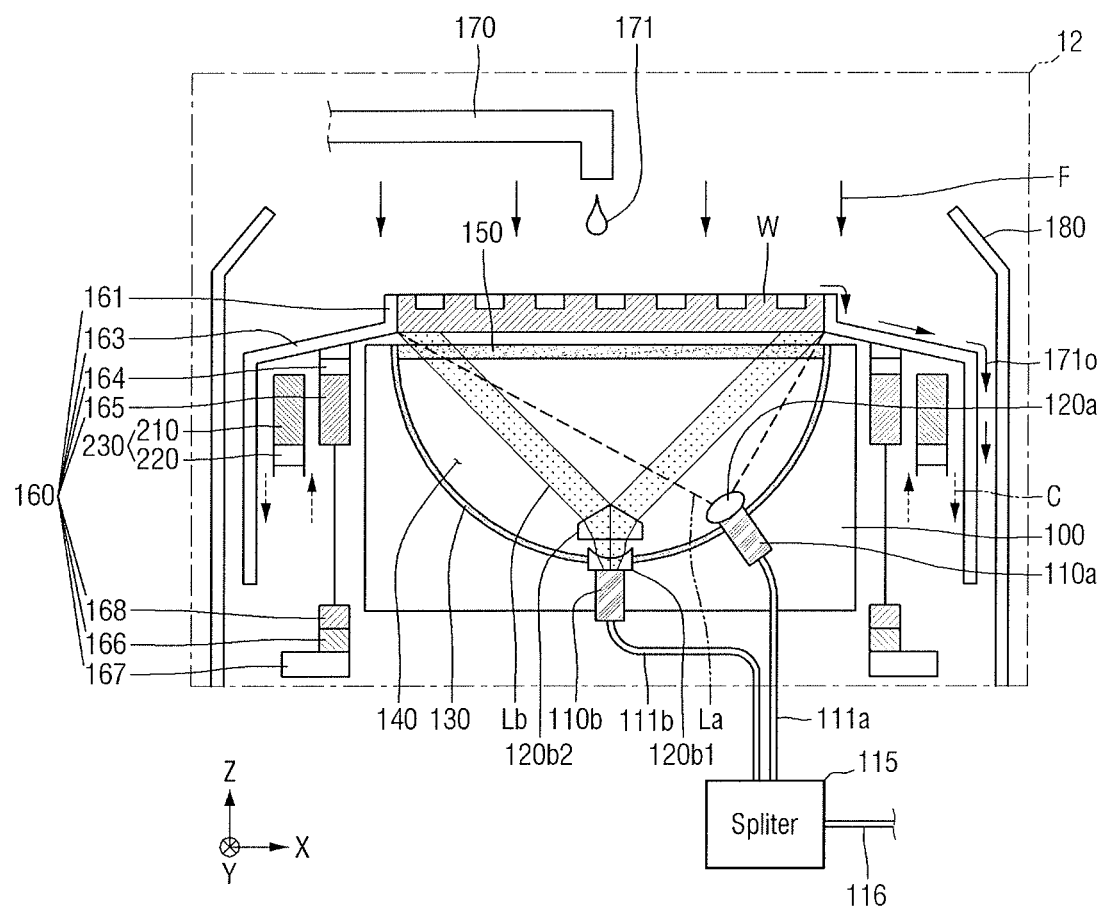
FIG. 13 illustrates a cross-sectional view of the wafer cleaning equipment according to some embodiments.

A third wafer cleaning equipment 12 according to some embodiments of will now be described with reference to FIG. 13. Repeated parts of the above-described embodiment will be simplified or omitted. FIG. 13 is a cross-sectional view of a wafer cleaning equipment according to some embodiments. Referring to FIG. 13, the third wafer cleaning equipment 12 according to some embodiments may include a splitter 115 and a source laser supply section 116.

The splitter 115 may receive the supply of the laser beam from the source laser supply section 116. The splitter 115 may be connected to a first laser supply section 111a and a second laser supply section 111b. The splitter 115 splits the laser supplied from the source laser supply section 116 into a first laser beam La and a second laser beam Lb, which are then supplied to the first laser supply section 111a and the second laser supply section 111b, respectively.

The first laser beam La output by the first laser module 110a may heat both the center region Rc and the edge region Re of the wafer W, e.g., uniformly. The second laser beam Lb output by the second laser module 110b may heat only the edge region Re of the wafer W. Therefore, the heating of the edge region Re may be relatively enhanced as compared to the heating of the center region Rc.

Figure 14:
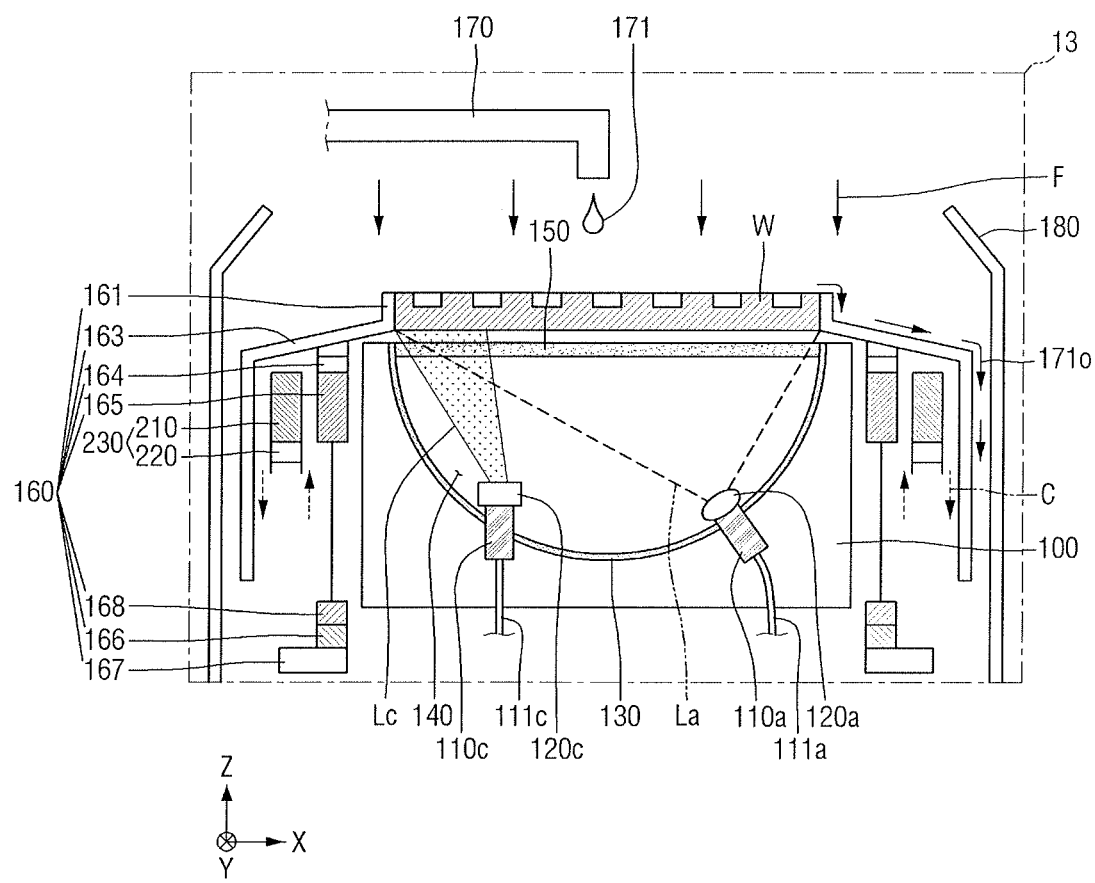
FIG. 14 illustrates a cross-sectional view of the wafer cleaning equipment according to some embodiments.

Hereinafter, a fourth wafer cleaning equipment 13 according to some embodiments will now be described with reference to FIGS. 3 and 14. Repeated parts of the above-described embodiment will be simplified or omitted. FIG. 14 is a cross-sectional view for explaining a wafer cleaning equipment according to some embodiments. Referring to FIGS. 3 and 14, the fourth wafer cleaning equipment 13 according to some embodiments may include a third laser module 110c.

The third laser module 110c may include a third laser supply section 111c and a first lens array 120c. The third laser beam Lc of the third laser module 110c may be supplied through the third laser supply section 111c. The third laser supply section 111c may be connected to the outside to form a path through which the third laser beam Lc is supplied.

The first lens array 120c may direct the third laser beam Lc to be incident on part of the edge region Re of the wafer W. Since the wafer W is rotated by the spinner 160, even if the third laser beam Lc is irradiated to a part of the edge region Re, the entire edge region Re may be heated by the third laser beam Lc during rotation of the wafer W. Therefore, the fourth wafer cleaning equipment 13 according to some embodiments may efficiently enhance the heating of the edge region Re at a relatively low cost.

Figure 15:
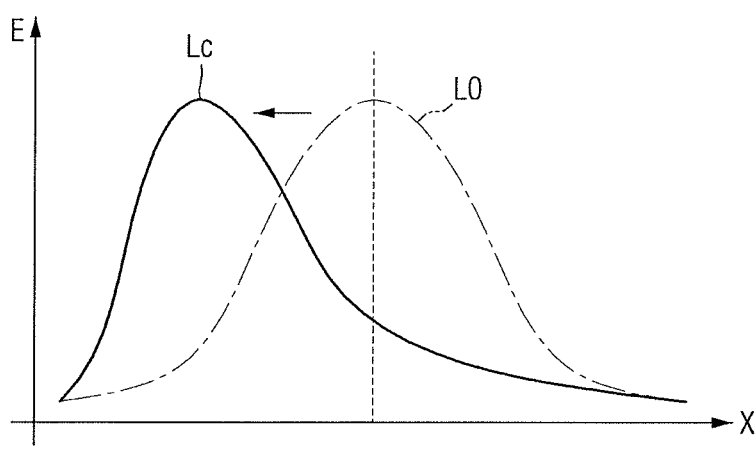
FIG. 15 illustrates distortion of the optical system of FIG. 14.

Hereinafter, a fourth wafer cleaning equipment 13 according to some embodiments will be described with reference to FIGS. 3, 14 and 15. Repeated parts of the above-described embodiment will be simplified or omitted. FIG. 15 is a graph of the distortion optical system of FIG. 14. Referring to FIGS. 3, 14 and 15, the first lens array 120c of the fourth wafer cleaning equipment 13 according to some embodiments may be a distortion optical system.

Referring to FIG. 15, the profile of the source laser beam L0 before passing through the first lens array 120c may be converted into an inclined third laser beam Lc. Here, the first lens array 120c is a distortion optical system that distorts the profile of the source laser beam in one direction, e.g., a tilted plate. Thus, the third laser beam Lc may further enhance the heating of the edge region Re.

Figure 16:
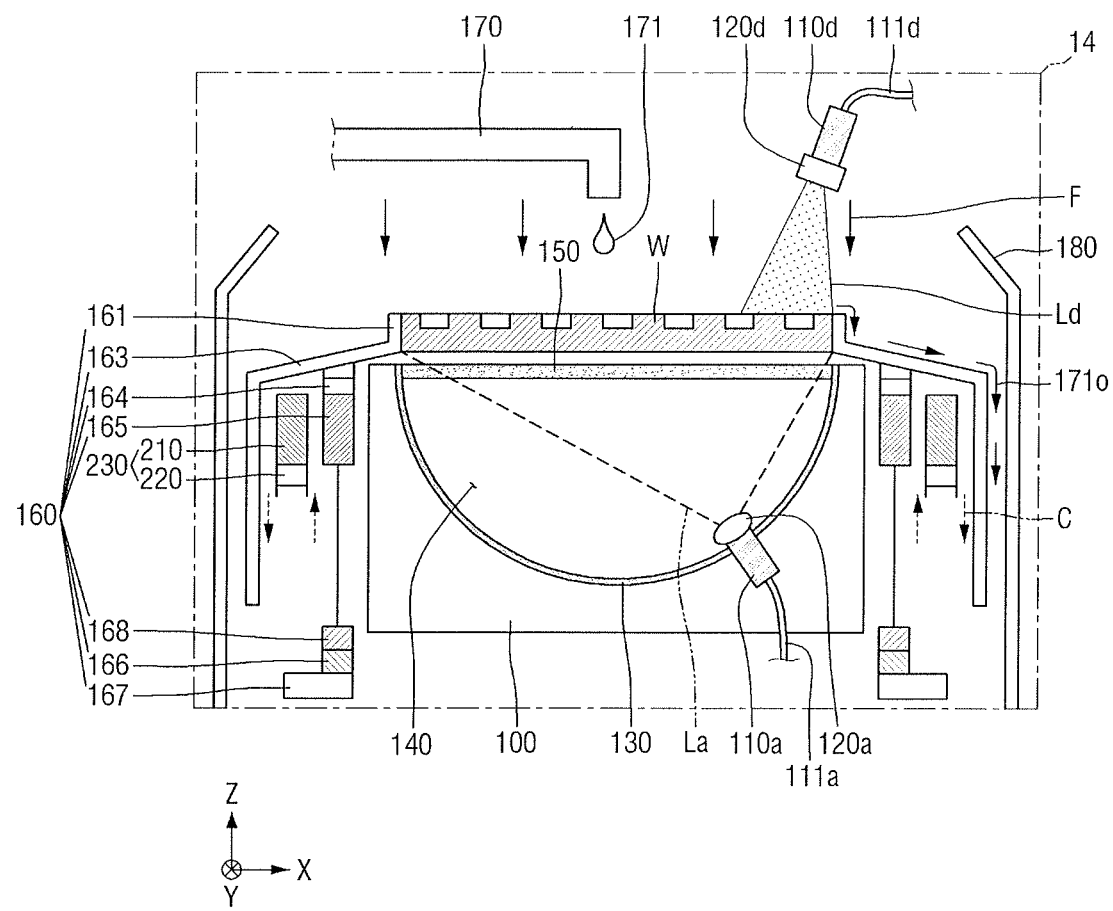
FIG. 16 illustrates a cross-sectional view of the wafer cleaning equipment according to some embodiments.

Hereinafter, a fifth wafer cleaning equipment 14 according to some embodiments will be described with reference to FIGS. 3 and 6. Repeated parts of the above-described embodiment will be simplified or omitted. FIG. 16 is a cross-sectional view of the wafer cleaning equipment according to some embodiments. Referring to FIGS. 3 and 16, a fifth wafer cleaning equipment 14 according to some embodiments may include a fourth laser module 110d.

The fourth laser module 110d may be disposed adjacent the upper surface $W_u$ of the wafer W. The fourth laser module 110d may heat the edge region Re of the wafer W, regardless of the first laser module 110a which heats the lower surface $W_1$ the wafer W. This enables more efficient heating of the edge region Re.

The fourth laser module 110d may include a fourth laser supply section 111d and a second lens array 120d. The fourth laser beam Ld of the fourth laser module 110d may be supplied through the fourth laser supply section 111d. The fourth laser supply section 111d may be connected to the outside to form a path through which the fourth laser beam Ld is supplied.

The second lens array 120d may direct the fourth laser beam Ld of the fourth laser module 110d to be incident on a part of the edge region Re of the wafer W. Since the wafer W is rotated by the spinner 160, even if the fourth laser beam Ld is only incident on part of the edge region Re, the entire edge region Re may be heated by the rotation of the wafer W. Thus, the fifth wafer cleaning equipment 14 according to some embodiments may efficiently enhance the heating of the edge region Re at a relatively low cost.

Figure 17:
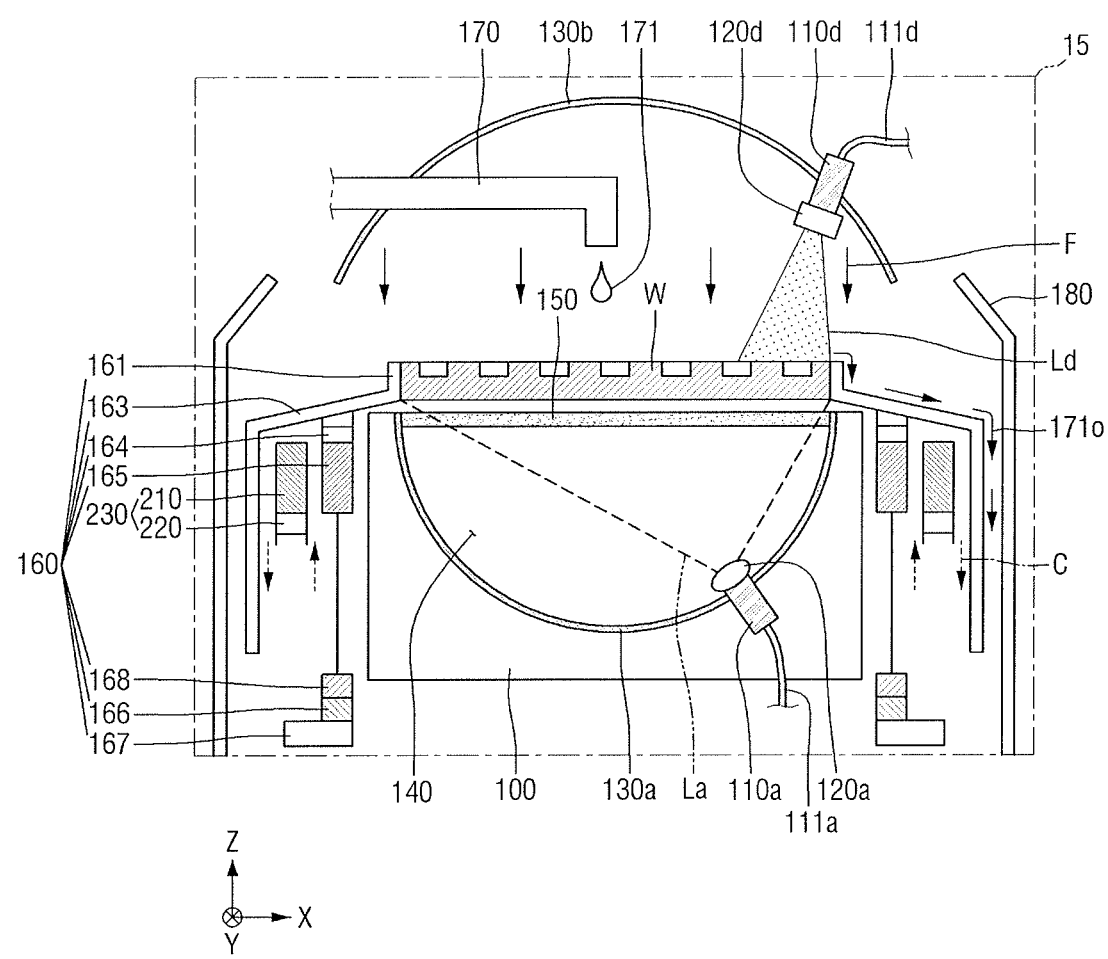
FIG. 17 illustrates a cross-sectional view of the wafer cleaning equipment according to some embodiments.

A sixth wafer cleaning equipment 15 according to some embodiments will be described below with reference to FIGS. 3 and 17. Repeated parts of the above-described embodiments will be simplified or omitted. FIG. 17 is a cross-sectional view for explaining the wafer cleaning equipment according to some embodiments. Referring to FIGS. 3 and 17, the sixth wafer cleaning equipment 15 may include a second reflector 130b, with the reflector 130 serving as a first reflector 130a.

The second reflector 130b may be located above the wafer W and may completely overlap the wafer W along the third direction Z. When the fourth laser beam Ld output by the fourth laser module 110d is reflected by the upper surface $W_u$ of the wafer W, the second reflector 130b may reflect the reflected fourth laser beam Ld to be incident on the upper surface $W_u$ of the wafer W again. Therefore, the heating efficiency of the fourth laser beam Ld on the upper surface $W_u$ of the wafer W may be significantly increased. In addition, it is possible to prevent the fourth laser beam Ld from being reflected and damaging other components of the sixth wafer cleaning equipment 15. Therefore, durability of the sixth wafer cleaning equipment 15 can also be improved.

Figure 18:
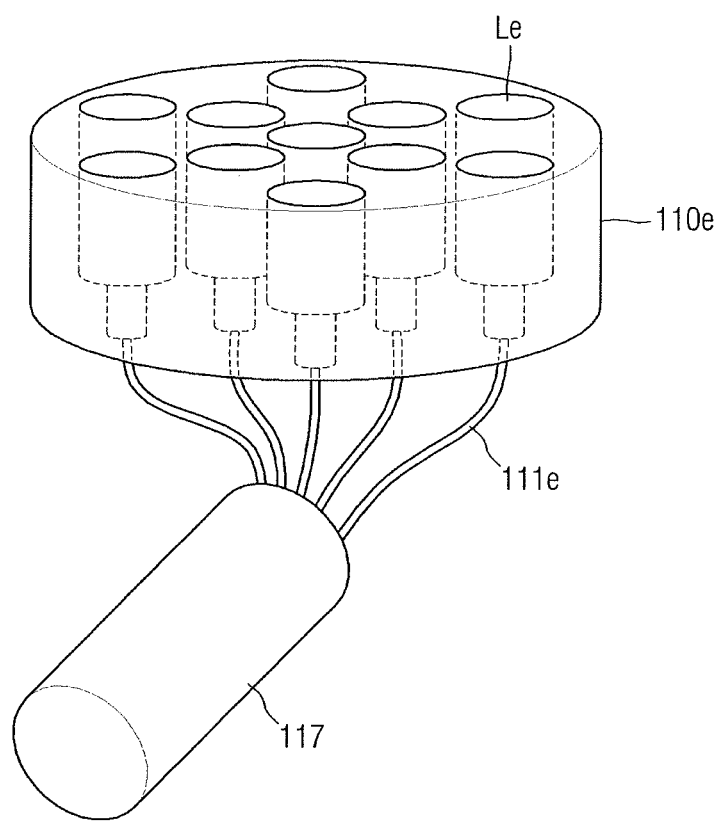
FIG. 18 illustrates a perspective view of a laser module of the wafer cleaning equipment according to some embodiments.
Figure 19:
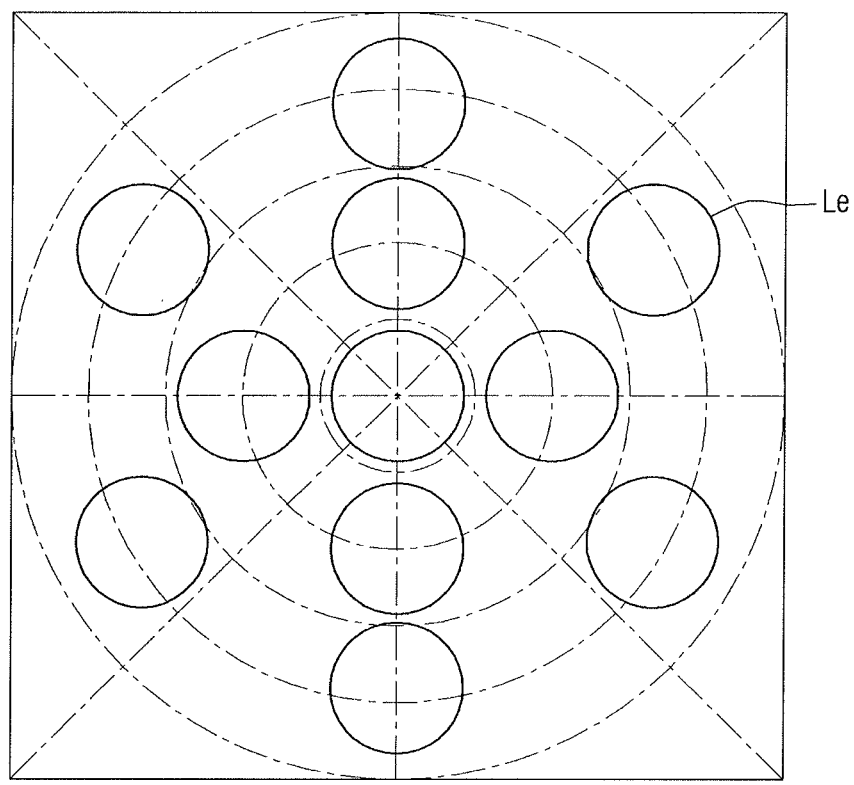
FIG. 19 illustrates a plan view of an arrangement of lasers emitted from the laser module of FIG. 18.
Figure 20:
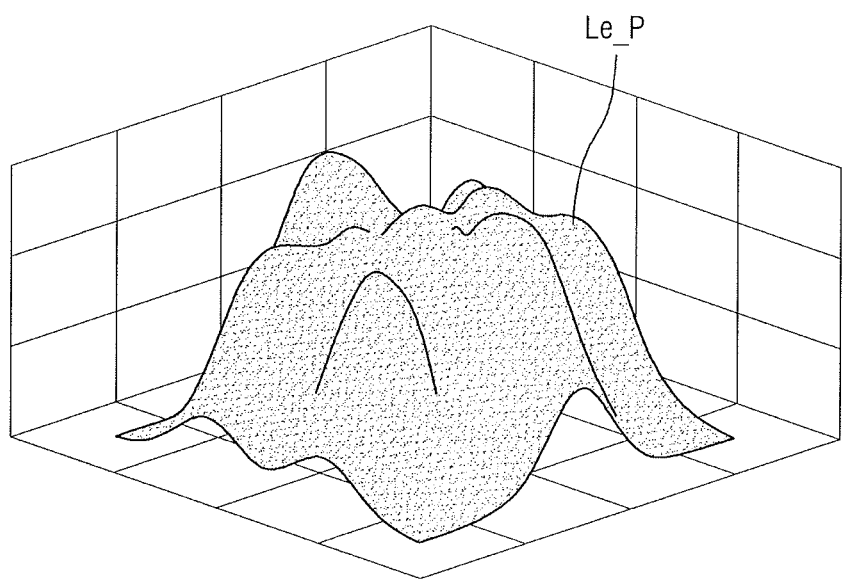
FIG. 20 illustrates a profile output from the arrangement of lasers according to FIG. 19.

Hereinafter, the first wafer cleaning equipment 10 according to some embodiments will be described with reference to FIGS. 18 to 20. Repeated parts of the above-described embodiments will be simplified or omitted. FIG. 18 is a perspective view for explaining a laser module of the wafer cleaning equipment according to some embodiment. FIG. 19 is a view for explaining the arrangement of laser irradiated from the laser module of FIG. 18. FIG. 20 is a view for explaining the profile of the laser according to FIG. 19. Referring to FIGS. 18 to 20, the wafer cleaning equipment according to some embodiments may include a fifth laser module 110e.

The fifth laser module 110e may include a plurality of laser sources Le. Each of the laser sources Le may output the laser beam L beam. The laser source Le may irradiate the laser beam L in the same direction by the fifth laser module 110e.

The fifth laser module 110e may include a plurality of fifth laser supply sections 111e. The plurality of fifth laser supplies 111e may correspond to the plurality of laser sources Le, respectively. The plurality of fifth laser supply sections 111e may be aligned and guided by the laser supply section guide 117.

The arrangement of the laser source Le may be as shown in FIG. 19. In an implementation, the arrangement of the laser source Le may be symmetrical. Also, the outputs of the plurality of laser sources Le may be adjusted individually.

Therefore, as illustrated in FIG. 20, a laser profile Le p may have a somewhat uniform profile as coming from a single laser source. The wafer cleaning equipment according to the present embodiment may heat the wafer W more strongly, using a plurality of laser sources Le. This makes it possible to significantly improve the etch rate of the wafer W.

Figure 21:
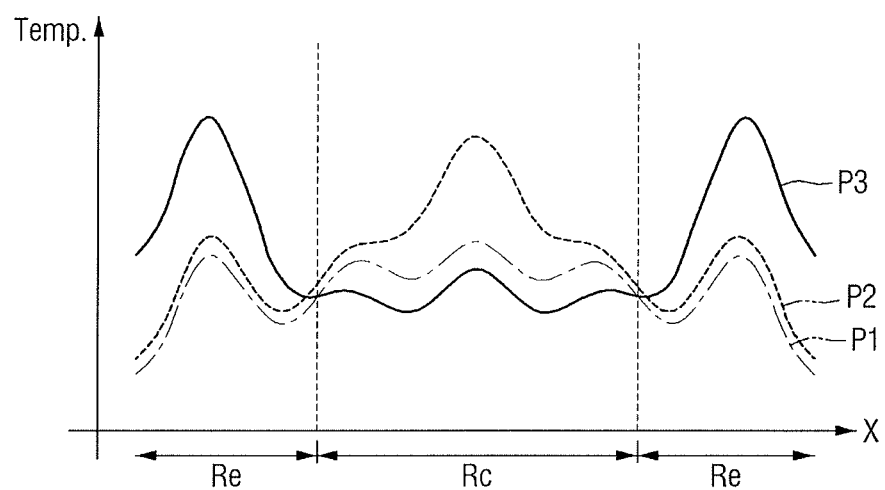
FIG. 21 illustrates a graph for explaining various heating profiles of the wafer cleaning equipment according to some embodiments.

FIG. 21 is a graph various heating profiles of the wafer cleaning equipment according to some embodiments. Referring to FIG. 21, the above-described wafer cleaning equipment may maintain the center region Rc and the edge region Re to be evenly heated as in the first profile P1, may increase the heating of the center region Rc relative to the edge region Re, as in the second profile P2, or may increase heating of the edge region Re relative to the center region Rc as in profile P3. That is, the degree of heating of the center region Rc and the edge region Re can be freely adjusted depending on purpose and necessity. This makes it possible to variously adjust the etch rate of the center region Re and the edge region Re and to etch the wafer W precisely.

By way of summation and review, wafer cleaning equipment according to one or more embodiment may easily adjust differences in the etching rate across the wafer by controlling a profile of a laser beam(s) that heat the wafer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A Wafer cleaning equipment, comprising:
a wafer holder configured to hold a wafer;
a housing positioned adjacent to the wafer holder;
a hollow region in the housing;
a laser module in the housing, the laser module protruding through a bottom of the hollow region, and the laser module outputting a laser beam having a profile that includes a first region having a first intensity and a second region having a second intensity greater than the first intensity, the laser beam being output into the hollow region;
a reflector on a surface of the housing, the reflector being shaped to define the hollow region to have a hemispherical shape; and
a transparent window that covers an upper part of the hollow region and transmits the laser beam to be incident on an entirety of a lower surface of the wafer.

2. The wafer cleaning equipment of claim 1, wherein the laser module includes:
a laser supply section that protrudes through the bottom of the hollow region and supplies the laser beam, and
an aspheric lens inside the hollow region that transforms the profile of the laser beam.

3. The wafer cleaning equipment of claim 2,
wherein the aspheric lens adjusts a width of the laser beam to be larger than that of the transparent window such that an outermost portion of the laser beam is reflected by the reflector before being incident on the transparent window.

4. The wafer cleaning equipment of claim 2, wherein the aspheric lens includes first and second lenses, and a distance between the first lens and the second lens is adjusted to control the profile of the laser beam.

5. The wafer cleaning equipment of claim 1, wherein the profile of the laser beam includes:
a first laser beam having a uniform profile in the first and second regions, and
a second laser beam only in the second region.

6. The wafer cleaning equipment of claim 5, wherein the laser module includes:
an aspheric lens that transforms the profile of the first laser beam into a uniform profile, and
an axicon lens that transform a profile of the second laser beam into a ring.

7. The wafer cleaning equipment of claim 5, further comprising:

a spinner that rotates the wafer, wherein the second laser beam heats part of the lower surface of the wafer.

8. The wafer cleaning equipment of claim 5, wherein the laser module includes a distortion optical system that tilts the profile of the second laser beam.

9. The wafer cleaning equipment of claim 5, wherein a position and an angle of the second laser beam are adjustable.

10. The wafer cleaning equipment of claim 5, wherein the laser module further includes a splitter that splits a source laser beam to generate the first and second laser beams.

11. The wafer cleaning equipment of claim 5, wherein profiles of the first and second laser beams are individually adjusted before reaching the lower surface of the wafer.

12. The wafer cleaning equipment of claim 1, further comprising an auxiliary laser module that provide an auxiliary laser beam to part of an upper surface of the wafer.

13. The wafer cleaning equipment of claim 12, further comprising an upper reflector that overlaps the wafer and re-reflects a laser beam reflected from the wafer back onto the upper surface of the wafer.

14. The wafer cleaning equipment of claim 1, wherein:
the first region is incident on a center region of the wafer, and
the second region is incident on an edge region of the wafer surrounding the first region.

15. A Wafer cleaning equipment, comprising:
a wafer holder configured to hold a wafer;
a housing positioned adjacent to the wafer holder;
a hollow region in the housing;
a laser module that outputs a laser beam having a profile that includes a center region having a first intensity and an edge region having a second intensity different from the first intensity, the laser beam being output into the hollow region;
a reflector on a surface of the housing, the reflector being shaped to define the hollow region to have a hemispherical shape; and
a transparent window that covers an upper part of the hollow region and transmits the laser beam to be incident on an entire lower surface of the wafer.

16. The wafer cleaning equipment of claim 15, wherein the second intensity is greater than the first intensity.

17. The wafer cleaning equipment of claim 16, wherein the profile of the laser beam provides uniform heating to the entire lower surface of the wafer.

18. The wafer cleaning equipment of claim 15, wherein the first intensity is greater than the second intensity.

19. The wafer cleaning equipment of claim 15, wherein the laser module includes a plurality of laser sources.

20. A Wafer cleaning equipment, comprising:
a wafer holder configured to hold a wafer that includes a center region and an edge region surround the center region;
a housing positioned adjacent to the wafer holder;
a hollow region in the housing;
a laser module that irradiates the wafer with a laser beam having a profile that includes a center region having a first intensity and an edge region having a second intensity greater than the first intensity;
a reflector on a surface of the housing, the reflector being shaped to define the hollow region to have a hemispherical shape; and
a transparent window that covers an upper part of the hollow region and transmits the laser beam to be incident on an entirety of a lower surface of the wafer.

* * * * *